United States Patent [19]
Prag

[11] 3,934,143
[45] Jan. 20, 1976

[54] DETECTOR FOR IONIZING RADIATION

[75] Inventor: Rudolf Prag, Marloffstein, Germany

[73] Assignee: Siemens Aktiengesellschaft, Erlangen, Germany

[22] Filed: Nov. 2, 1973

[21] Appl. No.: 412,431

[30] Foreign Application Priority Data
Nov. 10, 1972 Germany............................ 2255095

[52] U.S. Cl.................. 250/370; 250/211 J; 357/24
[51] Int. Cl. ............................................ G01t 1/24
[58] Field of Search............. 250/211 J, 370; 357/24

[56] References Cited
UNITED STATES PATENTS

| | | | |
|---|---|---|---|
| 2,963,390 | 12/1960 | Dickson | 250/211 J |
| 3,423,527 | 1/1969 | Collins | 250/211 J |
| 3,624,399 | 11/1971 | DenBoer | 250/370 |
| 3,689,772 | 9/1972 | George et al. | 250/211 J |
| 3,691,389 | 9/1972 | Ellis | 250/211 J |
| 3,803,416 | 4/1974 | Strauss | 250/370 |

*Primary Examiner*—Harold A. Dixon
*Attorney, Agent, or Firm*—Waters, Schwartz & Nissen

[57] ABSTRACT

A detector for ionizing radiation, comprising a semiconductor plate having electrode strips, which extend along the upper surface of the plate, which is passed through by the rays, from an edge portion of the semiconductor plate in the direction of its opposite edge portion, and which communicate with a signal utilizing arrangement, the latter of which forms signals from the signals tapped from the electrode strips in correspondence with or indicative of the locations of the focal points of the radiation spots produced on the detector. All electrode strips are positioned on one side of the semiconductor plate, and vary in cross-section along the direction of their longitudinal extension pursuant to a predetermined function, and wherein on the other side of the semiconductor plate there is mounted a common electrode covering substantially the entire surface of the plate.

5 Claims, 3 Drawing Figures

DETECTOR FOR IONIZING RADIATION

FIELD OF THE INVENTION

The present invention relates to a detector for ionizing rays, comprising a semiconductor plate having electrode strips, which extend along the upper surface of the plate, which is passed through by the rays, from an edge portion of the semiconductor plate in the direction of its opposite edge portion, and which communicate with a signal utilizing arrangement, the latter of which forms signals from the signals tapped from the electrode strips in correspondence with or indicative of the locations of the focal points of the radiation spots produced on the detector.

DISCUSSION OF THE PRIOR ART

A detector having a semiconductor plate and thereon positioned electrode strips is described in U.S. Pat. Nos. 3,529,159 and 3,529,161. In this known prior art detector, the electrode strips, which are positioned on the upper surface facing towards the radiation consist of gold, while the electrode strips positioned on the lower surface consist of aluminum. The monocrystal plate on which the electrode strips are mounted, consists of n-silicon. Insulation of the electrode strips from each other is attained, in that a voltage is applied to the electrodes so as to create a reduced strength layer which covers substantially the entire space between the electrodes and so as to thereby insulate the ohmic nature electrode strips relative to each other. The electrode strips of similarly directed nature are naturally insulated from each other.

In practice, however, it has been indicated that insulation of the ohmic nature electrode strips with respect to each other, such as in the example described in the Swiss patent with respect to the insulation of the aluminum electrodes, can only be unsatisfactorily effected. A mutual influence of the ohmic nature of the electrode strips on the tapped off signals from the lower surface of the detector is quite difficult to exclude. Consequently, this creates the danger that the signals delivered by the detector are falsified, in view of which the locations of the radiation spots on the detector cannot be exactly reproduced by means of the corresponding signals. Furthermore, extremely low-ohmic preamplifiers must be utilized, which is technically difficult to construct.

A detector of the above described type may be employed in conjunction with an image converter, pursuant to the U.S. Pat. No. 3,812,361. In this instance, the gamma energy elements emanating from a patient are coverted into electron beams which impinge on the detector. However, also in this utilization of a detector of the above-described type there is encountered the problem in providing a precise insulation, in particular of the electrode strips of ohmic nature with respect to each other, whereby the mutual influence of the tapped off signals from the electrode strips is reduced as much as possible.

SUMMARY OF THE INVENTION

It is, accordingly, an object of the present invention to provide a detector of the above-described type which provides good insulation between all electrode strips, so as to largely prevent any mutual influence being exerted over the electrical signals (transmission) tapped from the electrode strips.

This problem is inventively solved in that all electrode strips are positioned on one side of the semiconductor plate, and vary in cross-section along the direction of their longitudinal extension pursuant to a predetermined function, and wherein on the other side of the smiconductor plate there is mounted a common electrode covering substantially the entire surface of the plate. In the object of the invention, the locating signals are tapped exclusively from electrode strips of similarly directed nature which are insulated in a natural manner from each other. consequently, only a single electrode of an ohmic nature is present so as to practically entirely exclude any mutual influence of the signals. The signal tapped from an electrode strip depends thereby, due to the cross-sectional variation, upon the impinging location of the radiation in consideration of the longitudinal extension of the electrode strips. An assured locating sequence is thereby provided.

BRIEF DESCRIPTION OF THE DRAWING

Further advantages and details of the invention may be ascertained from the following detailed description of an exemplary embodiment, having reference to the accompanying drawing, in which.

DETAILED DESCRIPTION

Figure 1:
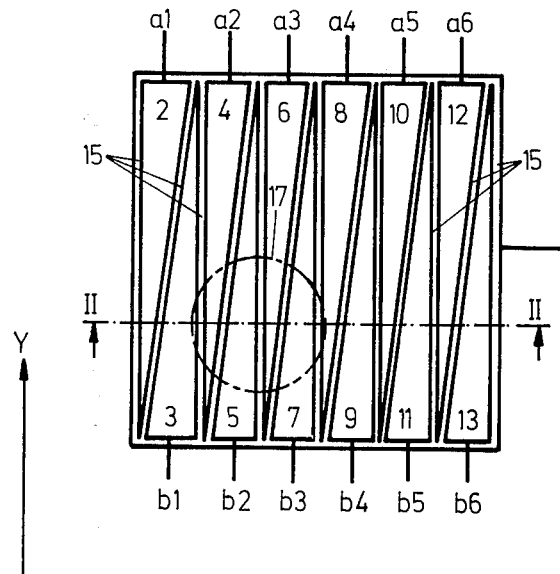
FIG. 1 is a plan view of a detector according to the present invention.
Figure 2:
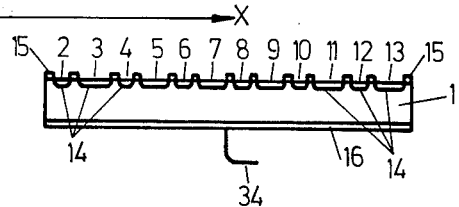
FIG. 2 is a sectional view through the detector taken along line II—II in FIG. 1.

The detector illustrated in FIGS. 1 and 2 includes a semiconductor member 1 on whose upper surface there are located triangularly-shaped electrode strips 2 to 13. The electrode strips 2 to 13 may be obtained by infusion into the semiconductor member 1 of a powdered silicon material, so as to form electrode strips 2 to 13 of p-conductive silicon, whereas the remaining portion of the semiconductor member 1 is constituted of n-conductive silicon. As p-pulverulent material boron or phosphorus may be infused into the semiconductor member 1. In this manner there are formed between the electrode strips 2 to 13 and the semiconductor body 1, pn-junctions 14. Between the electrode strips 2 to 13 there are positioned connectors 15 which are formed of silicon dioxide so as to effect the separation of the electron strips 2 to 13 from each other.

The diffusion depth of the infused powder material, and consequently the thickness of the electrode strips 2 to 13, depends upon the absorption properties for the to be received radiation.

On the lower surface of the semiconductor member 1 there is mounted a common electrode 16, which covers substantially the entire surface thereof, and which provides ohmic contact with the semiconductor member 1. The electrode 16 may, for example, be constituted of aluminum which is plated on the surface of the semiconductor member. The electrode strips 2 to 13 form telescoped triangles, which respectively extend from one edge of the detector to the other edge thereof. At two mutually opposite edges of the semiconductor member 1 there respectively follows a triangle side and a triangle corner in an alternating relationship. The electrode strips 2 to 13 vary in cross-section in the direction of their longitudinal extension in pursuance to a predetermined function.

From the electrode strips 2 to 13 there are tapped signals $a1$ through $a6$, and $b1$ through $b6$. These signals depend upon the position of the radiation spot appearing on the detector. One such radiation spot is illustrated, for example, in FIG. 1 through chain-dotted lines and identified by reference numeral 17. From the signals $a1$ through $a6$ and $b1$ through $b6$ there may be obtained x-signals and y-signals indicative of the position of the concentrating or focal points of the radiation spots, for example the radiation spot 17, in a coordinate system according to FIG. 1. An arrangement therefore is illustrated in FIG. 3 of the drawing.

Figure 3:
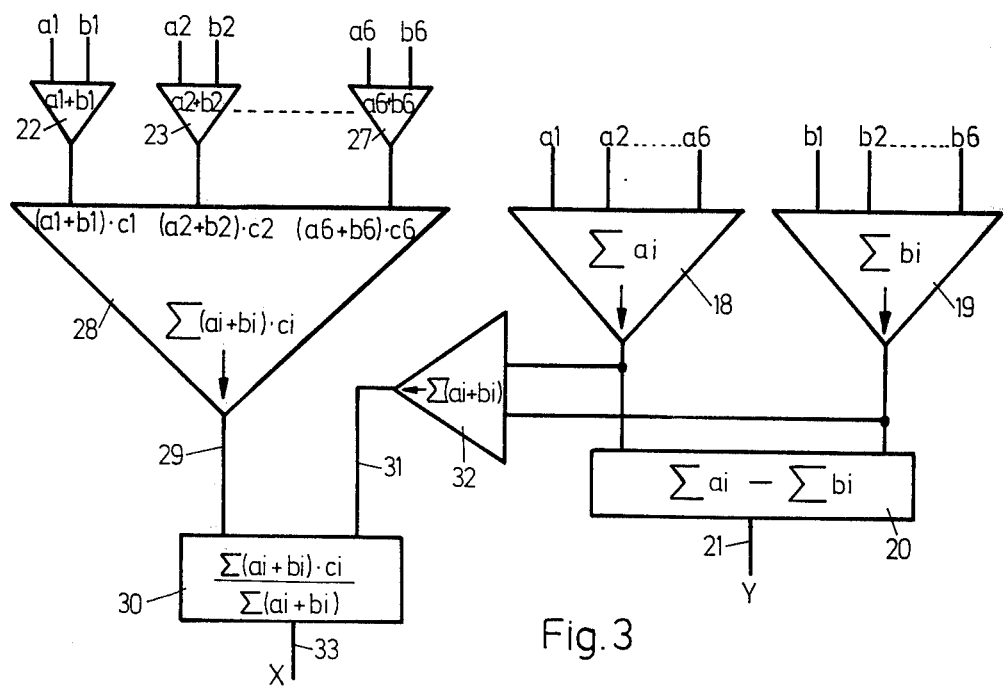
FIG. 3 is a schematic block diagram of a signal converting arrangement for the detector of FIGS. 1 and 2.

From FIG. 3 it may be ascertained that the signals $a1$ through $a6$ are conveyed to a summing element 18, which forms a summed signal $$\sum_{i=1}^{n} ai$$

therefrom. In an identical manner, the signals $b1$ through $b6$ are conveyed to a summing element 19 which forms therefrom a summed signal $$\sum_{i=1}^{n} bi.$$

$i$ extends therein from 1 through $n$ (1 through 6). These summed signals are then conveyed to a substracting element 20 which produces a differential signal $$\sum_{i=1}^{n} ai - \sum_{i=1}^{n} bi$$

at its output 21. This differential signal concurrently formulates the y-signal for the position of the focal point of the radiation spot 17, while the $a$-and $b$-signals depend upon the y-coordinate of the focal point of the beam spot 17 in correspondence with the cross-sectional variation of the electrode strips 2 to 13.

The $a$-and $b$-signals further are conveyed to adding elements 22 through 27, which form therefrom the sums $a1 + b1$, $a2 + b2$, and so forth. The output signals of the adding elements 22 through 27, which correspond to these sums, are conveyed to a calculating element 28, which next multiplies these output signals with factors $c1$ through $c6$ which characterize the abscissas of the electrode pairs $a1$, $b1$; $a2$, $b2$; and so forth, through $a6$, $b6$. The summed signal $a1 + b1$, and so forth, are then weighted next in the calculating element 28 pursuant to the abscissa of the coordinate system according to FIG. 1. Additionally, the calculating element 28 forms $$\sum_{i=1}^{n} (ai + bi) \times ci,$$

which means, $\Sigma$ $(a1 + b1)$ x $c1 + (a2 + b2)$ x $c2 + \text{- - -} (a6 + b6)$ x $c6$. The signals corresponding to this sum appears in the conduit 29 and is conveyed to a dividing element 30. The dividing element 30 has, through a conduit 31, conveyed thereto a signal formed by an adding element 32, which corresponds to $$\sum_{i=1}^{n} (ai + bi),$$

-continued in effect, a signal which is equal to the sum of signals $a1$ through $a6$ and $b1$ through $b6$. For this purpose, the adding element 32 is connected to the outputs of the adding elements 18 and 19.

The sums $$\sum_{i=1}^{n} (ai + bi) \times ci$$

may be formed directly in a summator, which has the ability to weight the inputs with coefficients. The signal $$\sum_{i=1}^{n} (ai + bi)$$

serves, in addition to the locating, also for providing discrimination against stray and background radiation of other types of energy as that of the utilized radiation.

The dividing element 30 forms a signal from the signals received at its inputs 29 and 31 which is equal to the quotient from $$\sum_{i=1}^{n} (ai + bi) \times ci \text{ and } \sum_{i=1}^{n} (ai + bi).$$

This signal, which is delivered at the output 33, corresponds to the abscissa of the focal point of the radiation spot 17.

The arrangement disclosed in FIG. 3 permits that from the signals $a1$ through $a6$ and $b1$ through $b6$ there are formed x-signals and y-signals, which embody the abscissas and the ordinates of the focal points of the radiation spots on the detector. By means of the arrangement of FIG. 3, there are formed locating signals which, for example, may be communicated to an imaging or copying apparatus for the production of gamma ray images. The detector according to FIGS. 1 and 2 may therefore be employed in a gamma camera for determining the distribution of radioactive materials in the body of a patient. The distribution of the radioactives materials can thereby be further reproduced on an imaging or copying apparatus. The detector according to FIGS. 1 and 2 is adapted for installation in an image converter, since it contains a scintillation crystal at its input, and in which the light ray is converted into electron beams which impinge on the upper surface of the detector of FIGS. 1 and 2 of the drawing. The radiation spots, in this instance represent electron spots.

The detector of FIGS. 1 and 2 also is adapted for directly locating ionizing radiation, insofar as it concerns itself with radiation particles and energy element in coincidence with the radiation, and which have a symmetric distribution of the radiation intensity.

It is an important aspect of the invention that all of the electron strips employed for obtaining of the locating signals, be positioned on one side of the semiconductor member 1. In this manner it becomes possible to form all electrode strips in the shape of pn-junctions in which a mutual influence on the tapped off signals (transmission) is practically excluded. Ohmic junctions between the electrode strips and the semiconductor member, as in the present state of the technology, may be completely eliminated through the present invention. In contrast to the state of the technology, pursuant to the present invention there is provided on the lower surface of the semiconductor member only a single electrode which covers substantially the entire surface of the lower side of the semiconductor member. This common electrode is connected to a common input conduit 34, which lies, for example on the material.

Within the scope of the invention, there may be utilized, in lieu of the illustrated triangularly-shaped electrodes, other electrode shapes having variable electrode cross-sections. It is further possible, by employing an semiconductor member having a circular base portion, to position the electrode strips in star-shapes in which all of these point toward the center of the circle. When using triangularly-shaped electrode strips, in this instance the triangle points lie approximately in the center of the circle. A positioning is in this instance possible by means of the basic formulation of polar coordinates.

While there has been shown what is considered to be the preferred embodiment of the invention, it will be obvious that modifications may be made which come within the scope of the disclosure of the specification.

What is claimed is:

1. In a detector for ionizing radiation, comprising semiconductor plate means having a plurality of electrode strip means, said electrode strip means being positioned on the surface of said semiconductor plate means passed through by said radiation and extending from a first edge of said semiconductor plate means in the direction of the opposite edge thereof; and signal converting means connected to said electrode strip means, said signal converting means including computing means being adapted to compute and generate signals in response to signals tapped off from said electrode strip means indicative of the locations of focal points of radiation spots generated on said detector, the improvement comprising; said plurality of electrode strip means each varying in cross-section along the length thereof being positioned on said one surface of said semiconductor plate means and varying in cross-section along their longitudinal extensions in conformance with a predetermined function; a plurality of connectors each respectively connecting one of said electrode strip means to said signal converting means for separately transmitting the signals from each said electrode strip means to said signal converting means; and a common electrode means being positioned on the opposite surface of said semiconductor plate means and being dimensioned so as to cover substantially said entire surface said computing means being connected to derive a signal as a mathematical function of the signals on a plurality of said connectors.

2. A detector as claimed in claim 1, said plurality of electrode strip means extending from said one edge of the surface of said semiconductor plate means to the other edge in a substantially triangularly-shaped configuration.

3. A detector as claimed in claim 2, said triangularly-shaped electrode strip means being positioned on said surface in telescoped relationship so as to form on two oppositely located edges of said semiconductor plate means alternately a triangle side and a triangle point in sequential order.

4. A detector as claimed in claim 1, said plurality of electrode strip means being formed essentially of p-conductive silicon, and said semiconductor plate means being formed essentially of n-conductive silicon.

5. A detector as claimed in claim 1, said common electrode means being constituted essentially of aluminum.

* * * * *